(12) United States Patent
Song et al.

(10) Patent No.: US 10,629,523 B2
(45) Date of Patent: Apr. 21, 2020

(54) VIA-BASED VERTICAL CAPACITOR AND RESISTOR STRUCTURES

(71) Applicant: QUALCOMM Incorporated, San Diego, CA (US)

(72) Inventors: Chao Song, San Diego, CA (US); Ye Lu, San Diego, CA (US); Haitao Cheng, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/126,406

(22) Filed: Sep. 10, 2018

(65) Prior Publication Data

US 2020/0083158 A1 Mar. 12, 2020

(51) Int. Cl.
*H01L 29/00* (2006.01)
*H01L 23/522* (2006.01)
*H01L 27/01* (2006.01)

(52) U.S. Cl.
CPC ...... *H01L 23/5223* (2013.01); *H01L 23/5226* (2013.01); *H01L 23/5228* (2013.01); *H01L 27/01* (2013.01)

(58) Field of Classification Search
CPC .............. H01L 23/5223; H01L 23/642; H01L 23/5226; H01L 23/5227; H01L 27/04; H01L 27/101; H01L 27/3265
USPC ........................................................ 257/532
See application file for complete search history.

(56) References Cited

U.S. PATENT DOCUMENTS

2016/0049393 A1* 2/2016 Jing .................... H01L 27/0805
257/532

* cited by examiner

*Primary Examiner* — Theresa T Doan
(74) *Attorney, Agent, or Firm* — Patterson & Sheridan, L.L.P.

(57) ABSTRACT

Certain aspects of the present disclosure provide an integrated circuit (IC) that includes at least one of a via-based vertical capacitor structure or a via-based vertical resistor structure. The IC includes a substrate oriented in a horizontal plane, electrically conductive layers disposed above the substrate, and electrically insulative layers disposed above the substrate and interposed between the plurality of electrically conductive layers. At least one of the vertical capacitor structure or the vertical resistor structure is disposed in the electrically conductive layers and the electrically insulative layers.

12 Claims, 9 Drawing Sheets

VIA-BASED VERTICAL CAPACITOR AND RESISTOR STRUCTURES

TECHNICAL FIELD

Certain aspects of the present disclosure generally relate to electronic circuits and, more particularly, to an integrated circuit that includes at least one of a vertical capacitor structure or a vertical resistor structure.

BACKGROUND

Electronic devices (e.g., computers, laptops, tablets, copiers, digital cameras, smart phones, and the like) often employ integrated circuits (ICs, also known as "chips"). These integrated circuits are typically implemented as semiconductor dies packaged in integrated circuit packages. The semiconductor dies may include numerous active devices and/or passive devices located on-chip. These devices may occupy a large amount of area on the chip, reducing the amount of space available for other components.

SUMMARY

Certain aspects of the present disclosure provide an integrated circuit. The integrated circuit generally includes a substrate oriented in a horizontal plane; a plurality of electrically conductive layers disposed above the substrate; a plurality of electrically insulative layers disposed above the substrate and interposed between the plurality of electrically conductive layers; and a vertical capacitor structure disposed in the plurality of electrically conductive layers and the plurality of electrically insulative layers. The vertical capacitor structure includes a first interconnection element disposed above the substrate; a second interconnection element disposed above the first interconnection element; one or more first fingers coupled to the first interconnection element and extending therefrom through a first set of the plurality of electrically conductive layers and through a first set of the plurality of electrically insulative layers, in a first vertical direction with respect to the horizontal plane of the substrate; and one or more second fingers coupled to the second interconnection element and extending therefrom through a second set of the plurality of electrically conductive layers and through a second set of the plurality of electrically insulative layers, in a second vertical direction with respect to the horizontal plane of the substrate. The first and second fingers have a capacitance therebetween.

Certain aspects of the present disclosure provide an integrated circuit. The integrated circuit includes a vertical resistor structure. The integrated circuit includes a substrate oriented in a horizontal plane; a plurality of electrically conductive layers disposed above the substrate; a plurality of electrically insulative layers disposed above the substrate and interposed between the plurality of electrically conductive layers; and a vertical resistor structure disposed in the plurality of electrically conductive layers and the plurality of electrically insulative layers. The vertical resistor structure includes a first set of interconnection elements disposed above the substrate; a second set of interconnection elements disposed above the first set of interconnection elements; and a plurality of fingers disposed between the first set of interconnection elements and the second set of interconnection elements. Each finger of the plurality of fingers extends vertically across the plurality of electrically conductive layers and the plurality of electrically insulative layers, with respect to the horizontal plane of the substrate. At least one of the plurality of fingers is coupled to one of the first set of interconnection elements and to one of the second set of interconnection elements.

Certain aspects of the present disclosure provide a method for fabricating an integrated circuit with a vertical capacitor structure. The method generally includes forming a substrate oriented in a horizontal plane; forming a plurality of electrically conductive layers above the substrate; forming a plurality of electrically insulative layers above the substrate and interposed between the plurality of electrically conductive layers; and forming the vertical capacitor structure in the plurality of electrically conductive layers and the plurality of electrically insulative layers. Forming the vertical capacitor structure includes forming a first interconnection element above the substrate; forming a second interconnection element above the first interconnection element; forming one or more first fingers that couple to the first interconnection element and extend therefrom through a first set of the plurality of electrically conductive layers and through a first set of the plurality of electrically insulative layers, in a first vertical direction with respect to the horizontal plane of the substrate; and forming one or more second fingers that couple to the second interconnection element and extend therefrom through a second set of the plurality of electrically conductive layers and through a second set of the plurality of electrically insulative layers, in a second vertical direction with respect to the horizontal plane of the substrate. The first and second fingers have a capacitance therebetween.

Certain aspects of the present disclosure provide a method for fabricating an integrated circuit with a vertical resistor structure. The method generally includes forming a substrate oriented in a horizontal plane; forming a plurality of electrically conductive layers above the substrate; forming a plurality of electrically insulative layers above the substrate and interposed between the plurality of electrically conductive layers; and forming the vertical resistor structure in the plurality of electrically conductive layers and the plurality of electrically insulative layers. Forming the vertical resistor structure includes forming a first set of interconnection elements above the substrate; forming a second set of interconnection elements above the first set of interconnection elements; and forming a plurality of fingers between the first set of interconnection elements and the second set of interconnection elements. Each finger of the plurality of fingers extends vertically across the plurality of electrically conductive layers and the plurality of electrically insulative layers, with respect to the horizontal plane of the substrate. At least one of the plurality of fingers is coupled to one of the first set of interconnection elements and to one of the second set of interconnection elements.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Aspects of the present disclosure provide vertical capacitor structures and vertical resistor structures suitable for increasing the density of components located on an integrated circuit, for example. More specifically, aspects presented herein provide vertical capacitor structures and vertical resistor structures with reduced area footprints, reduced parasitic capacitance, and that allow for a process invariant resistor-capacitor (RC) time constant, compared to components within the integrated circuit that are oriented in parallel with a horizontal plane of the integrated circuit, for example.

The following description provides examples, and is not limiting of the scope, applicability, or embodiments set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected there between).

In conventional integrated circuits (ICs) (also referred to as "chips"), passive components (e.g., resistors, capacitors, etc.) located on-chip are typically oriented horizontally (e.g., in parallel) with respect to the horizontal plane of the chip substrate (e.g., silicon (Si) substrate). However, passive components that are oriented horizontally with respect to the chip substrate may occupy a significantly large area footprint on the chip.

Figure 1:
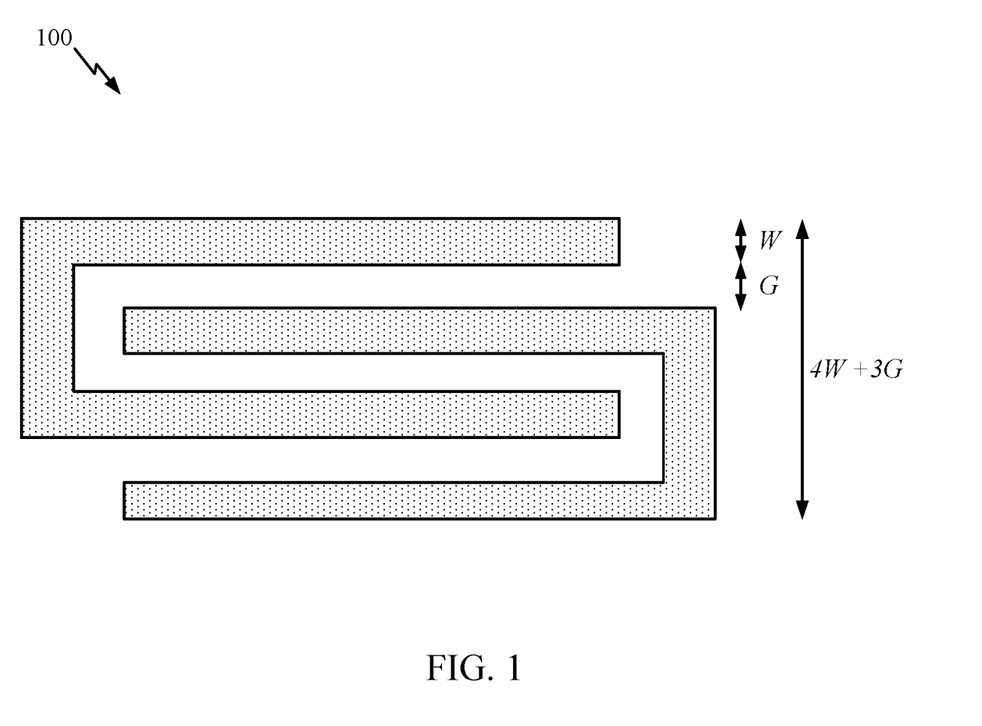
FIG. 1 illustrates a top view of an example horizontal capacitive component.
Figure 2A:
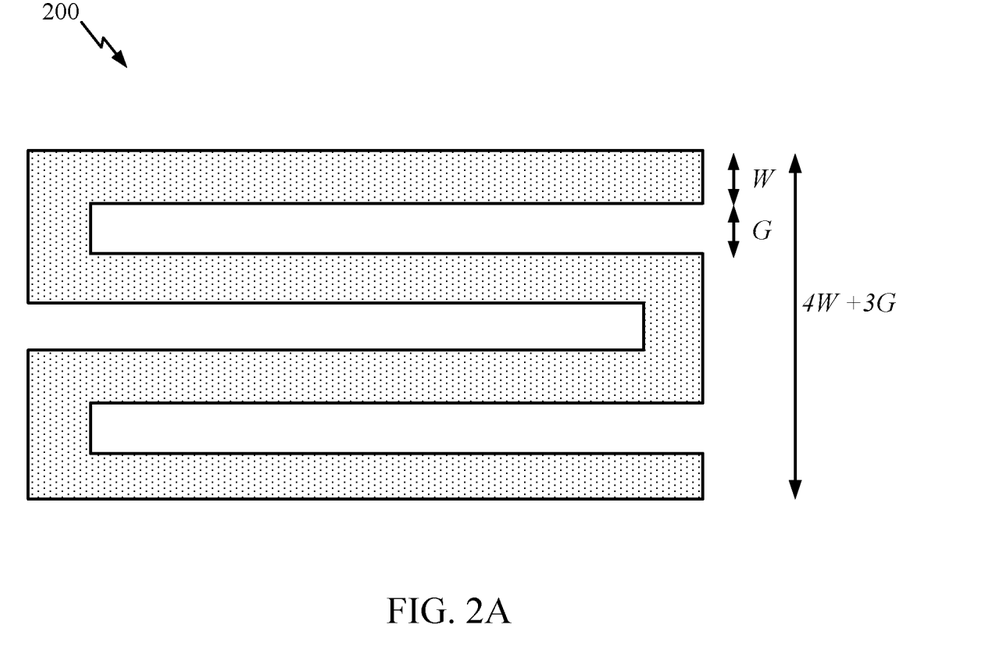
FIG. 2A illustrates a top view of an example horizontal metallic resistive component.
Figure 2B:
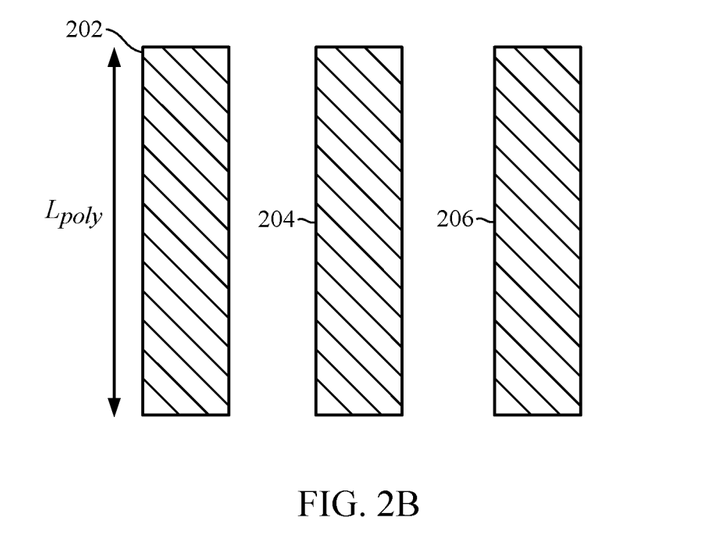
FIG. 2B illustrates a top view of example horizontal polysilicon resistive components.

FIG. 1, for example, shows the top view of a capacitive component 100 (e.g., interdigitated metal capacitor), oriented horizontally with respect to the chip substrate, that occupies a large silicon area footprint. In particular, as shown, the capacitive component 100 may occupy a minimum width approximately equal to 4 W+3 G, where W is the width of a trace and G is the width of a gap (i.e., spacing) between traces. In cases where W is equal to G, the capacitive component 100 may occupy a minimum width approximately equal to 7 W. Further, while the above example assumes that the width of each trace is the same (e.g., W), in some cases, the widths of the traces within the capacitive component 100 may be different. In another example, FIG. 2A shows the top view of a resistive component 200 (e.g., metal resistor), arranged in a plane parallel with the horizontally oriented chip substrate, that occupies a large silicon area footprint. In particular, as shown, the resistive component 200 may occupy a minimum width approximately equal to 4 W+3 G (or 7 W, assuming W=G). In another example, FIG. 2B shows the top view of three resistive components 202, 204, and 206 (e.g., polysilicon resistors), oriented horizontally with respect to the chip substrate, that occupy a relatively large silicon area footprint. In particular, to achieve a desired resistance R, each resistive component 202, 204, and 206 may have a width determined based on $$R = \rho \frac{L_{poly}}{A_{poly}},$$

where R is the resistance of the resistive component, $\rho$ is the resistivity of polysilicon in the resistive component, $L_{poly}$ is the length of polysilicon in the resistive component, and $A_{poly}$ is the cross-sectional area of polysilicon (e.g., through which current flows) in the resistive component. $A_{poly}=W_{poly}T_{poly}$, where $W_{poly}$ is the width of the polysilicon in the resistive component, and $T_{poly}$ is the thickness of the polysilicon.

The structure/orientation of passive components (e.g., capacitive component 100, resistive component(s) 200, 202, 204, 206, etc.) may reduce the efficiency and performance of the chip. Using capacitive component 100 as a reference example, the area footprint associated with capacitive component 100 may reduce the amount of available space located on the chip for other components, which in turn reduces area efficiency. In addition, compared to the vertical component structures described herein, the structure of capacitive component 100 can lead to increased parasitic capacitance, e.g., due to the amount of area (e.g., of the traces) in parallel and proximate to the chip substrate.

Further, in some cases, integrated circuits that have both resistor and capacitor components located on chip may suffer from process-dependent RC time constant variation. For example, in general, process variations in attributes (e.g., length, width, thickness, etc.) of chip components can occur during fabrication of the integrated circuit. In one reference example, assuming an integrated circuit includes a polysilicon resistor (e.g., resistive component 202) and interdigitated metal capacitor (e.g., capacitive component 100), process variations may cause a RC time constant variation of up to ±30%. Accordingly, it may be desirable to provide passive component structures that have reduced area footprints and/or reduced parasitic capacitances for integrated circuits. Additionally, it may also be desirable to provide integrated circuits that have a process-invariant RC time constant (or at least less process-dependent with lower variation).

Certain aspects of the present disclosure provide structures for passive components (e.g., capacitors, resistors, etc.) that are oriented vertically with respect to a horizontal plane of a chip substrate. The structures described herein may be suitable, for example, for integrated circuit devices that include, but are not limited to, delay cells, clock trees, oscillators, decoupling capacitors, etc. As described in more detail below, the vertical capacitor structures and vertical resistor structures may include multiple (stacked) vias that extend vertically through multiple electrically conductive layers and multiple electrically insulative layers (of an integrated circuit) with respect to the horizontal plane of the chip substrate. By structuring passive components vertically in this manner, aspects presented herein can reduce the amount of horizontal area occupied by such components on the substrate, reduce the parasitic capacitance of these components in an integrated circuit, and/or provide a process-invariant RC time constant. As used herein, "vertical direction" or "vertical" generally refers to the z-direction, and "horizontal direction" or "horizontal" generally refers to directions in the x-y plane.

Figure 3:
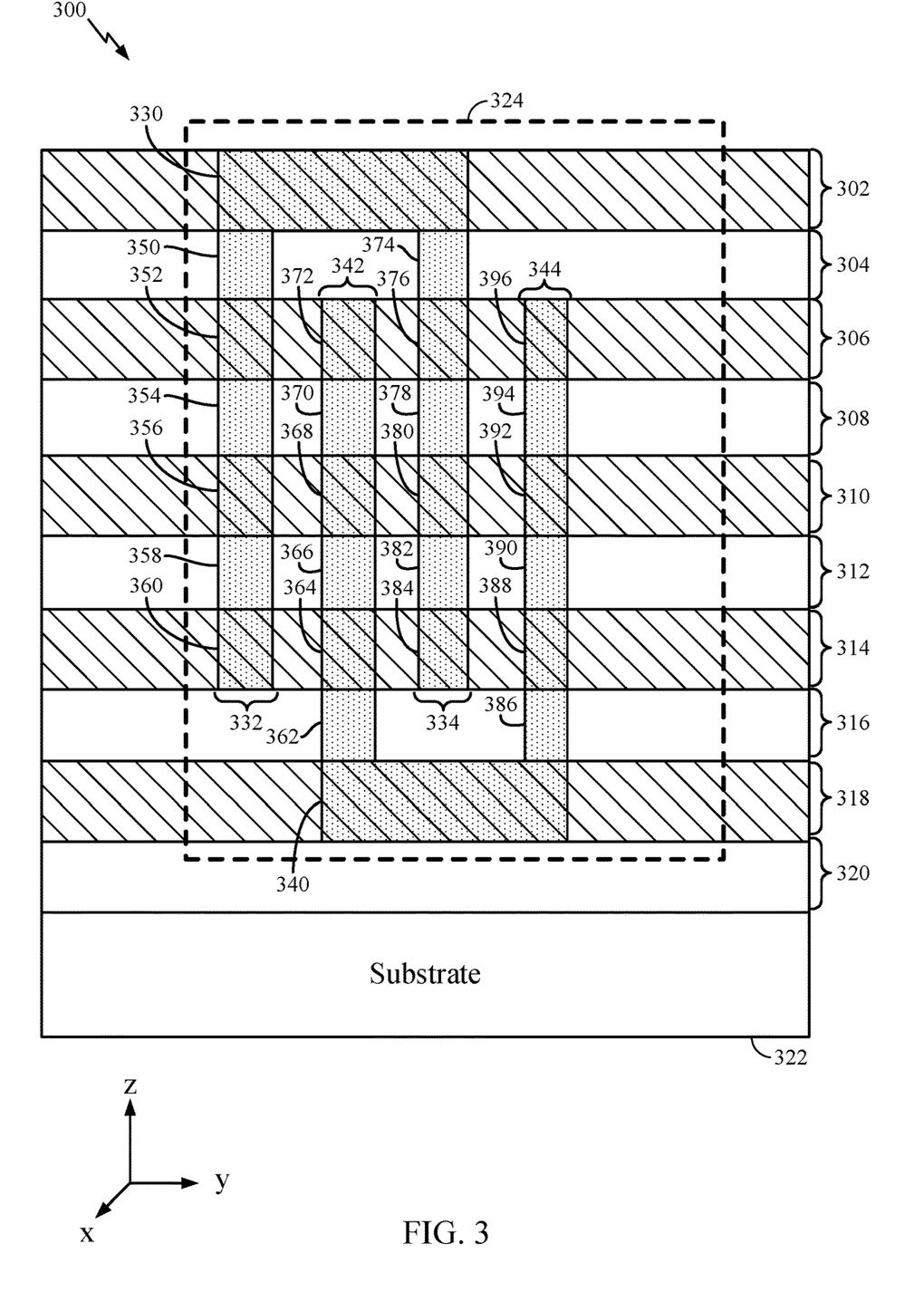
FIG. 3 illustrates a cross-sectional view of an integrated circuit that includes a via-based vertical capacitor structure, in accordance with certain aspects of the present disclosure.

FIG. 3 illustrates a cross-sectional view of an example integrated circuit (IC) 300 with a vertical capacitor structure 324, in accordance with certain aspects of the present disclosure. As shown, the IC 300 includes a substrate 322 (e.g., Si substrate) with a horizontal orientation in the x-y plane; electrically conductive layers 302, 306, 310, 314, and 318 (collectively referred to as "electrically conductive layers of IC 300") disposed above the substrate 322; and electrically insulative layers 304, 308, 312, and 316 (collectively referred to as "electrically insulative layers of IC 300") disposed above the substrate 322. While the IC 300 is depicted as having five electrically conductive layers, the reader is to understand that the IC 300 may include more or less than five electrically conductive layers. Similarly, while the IC 300 is depicted as having four electrically insulative layers, the reader is to understand that the IC 300 may include more or less than four electrically insulative layers.

In some aspects, each electrically insulative layer 304, 308, 312, and 316 may be disposed between a different pair of electrically conductive layers. In this particular example, electrically insulative layer 304 is disposed between electrically conductive layers 302 and 306; electrically insulative layer 308 is disposed between electrically conductive layers 306 and 310; electrically insulative layer 312 is disposed between electrically conductive layers 310 and 314; and electrically insulative layer 316 is disposed between electrically conductive layers 314 and 318. In other words, the electrically insulative layers may be interposed between the electrically conductive layers. In some aspects, the IC 300 may include a portion 320 disposed between the substrate 322 and the electrically conductive layer 318. The portion 320 may include multiple layers (not shown in FIG. 3) of the same or different materials. In some aspects, the portion 320 may include a dielectric material as illustrated.

Each of the electrically conductive layers of IC 300 may include a metal (e.g., copper (Cu), aluminum (Al), etc.), metal alloy, or silicon alloy. In some aspects, the electrically conductive layers of IC 300 may include the same material (e.g., metal, metal alloy, silicon alloy). In other aspects, at least one of the electrically conductive layers of IC 300 may include a different material than another one of the electrically conductive layers of IC 300.

Each of the electrically insulative layers of IC 300 may include a dielectric material (or a mixture of dielectric materials), such as aluminum oxide ($Al_2O_3$), silicon dioxide ($SiO_2$), silicon nitride ($Si_3N_4$), etc. While each of the electrically conductive layers of IC 300 and each of the electrically insulative layers of IC 300 are depicted as having approximately the same height/thickness, the reader is to understand that each of the electrically conductive layers of IC 300 and/or each of the electrically insulative layers of IC 300 can have a different height/thickness from other layers.

As shown, the vertical capacitor structure 324 is disposed in the electrically conductive layers of IC 300 and the electrically insulative layers of IC 300. Although the vertical capacitor structure 324 is shown as occupying nearly all of the electrically conductive layers of IC 300 and the electrically insulative layers of IC 300 in the example of FIG. 3, the vertical capacitor structure 324 need not utilize all or even the majority of the electrically conductive layers of IC 300 and the electrically insulative layers of IC 300. The vertical capacitor structure 324 includes an interconnection element 340 disposed in the electrically conductive layer 318 above the substrate 322, and an interconnection element 330 disposed in the electrically conductive layer 302 above the interconnection element 340. Each of the interconnection elements 340 and 330 may include a metal, metal alloy, or silicon alloy, e.g., for an electrically conductive trace of the respective interconnection element.

Each of the interconnection elements 340 and 330 is coupled to one or more fingers. In this particular example, the interconnection element 340 is coupled to fingers 342 and 344, each of which extends from the interconnection element 340 through the electrically insulative layers 316, 312, and 308, and the electrically conductive layers 314, 310, and 306, in a vertical direction (e.g., positive z direction) towards the interconnection element 330 (e.g., with respect to the substrate 322 oriented in the x-y plane). Similarly, the interconnection element 330 is coupled to fingers 332 and 334, each of which extends from the interconnection element 330 through the electrically insulative layers 304, 308, and 312, and the electrically conductive layers 306, 310, and 314, in a vertical direction (e.g., negative z direction) towards the interconnection element 340 (e.g., with respect to the substrate 322 oriented in the x-y plane). Due to the dielectric properties of the insulative layers, a capacitance exists between the fingers 332, 334 of the interconnection element 330 and the fingers 342, 344 of the interconnection element 340. Finger 342 is interposed laterally between fingers 332 and 334, and finger 334 is interposed laterally between fingers 342 and 344. Although FIG. 3 depicts each of the interconnection elements 330 and 340 being coupled to two fingers, the reader is to understand that the interconnection elements 330 and 340 may be coupled to more or less than two fingers.

In some aspects, the fingers 332, 334, 342, and 344 may include one or more vias that extend through different sets of the electrically conductive layers of IC 300 and the electrically insulative layers of IC 300. In this example, finger 332 includes (stacked) vias 350, 352, 354, 356, 358, and 360 that extend (from interconnection element 330) through the electrically insulative layers 304, 308, and 312 and through the electrically conductive layers 306, 310, and 314 in a vertical direction (e.g., negative z direction) towards the interconnection element 340. Likewise, finger 334 includes (stacked) vias 374, 376, 378, 380, 382, and 384 that extend (from interconnection element 330) through the electrically insulative layers 304, 308, and 312 and through the electrically conductive layers 306, 310, and 314 in a vertical direction (e.g., negative z direction) towards the interconnection element 340. Finger 342 includes (stacked) vias 362, 364, 366, 368, 370, and 372 that extend (from interconnection element 340) through the electrically insulative layers 316, 312, and 308 and through the electrically conductive layers 314, 310, and 306 in a vertical direction (e.g., positive z direction) towards the interconnection element 330. Similarly, finger 344 includes (stacked) vias 386, 388, 390, 392, 394, and 396 that extend (from interconnection element 340) through the electrically insulative layers 316, 312, and 308 and through the electrically conductive layers 314, 310, and 306 in a vertical direction (e.g., positive z direction) towards the interconnection element 330.

In some aspects, each of the vias within the respective fingers 332, 334, 342, and 344 may be electrically isolated from other electrically conductive elements in each electrically conductive layer through which the respective finger extends. For example, vias 352, 356, and 360 of finger 332 and vias 376, 380, and 384 of finger 334 may be electrically isolated from electrically conductive elements in electrically conductive layers 306, 310, and 314, respectively. Similarly, vias 364, 368, and 372 of finger 342 and vias 388, 392, and 396 of finger 344 may be electrically isolated from electrically conductive elements in electrically conductive layers 314, 310, and 306, respectively. In some aspects, the electrically conductive trace of the interconnection elements 330 and 340 may be coupled to electrically conductive elements within one or more of the electrically conductive layers of IC 300.

Figure 4:
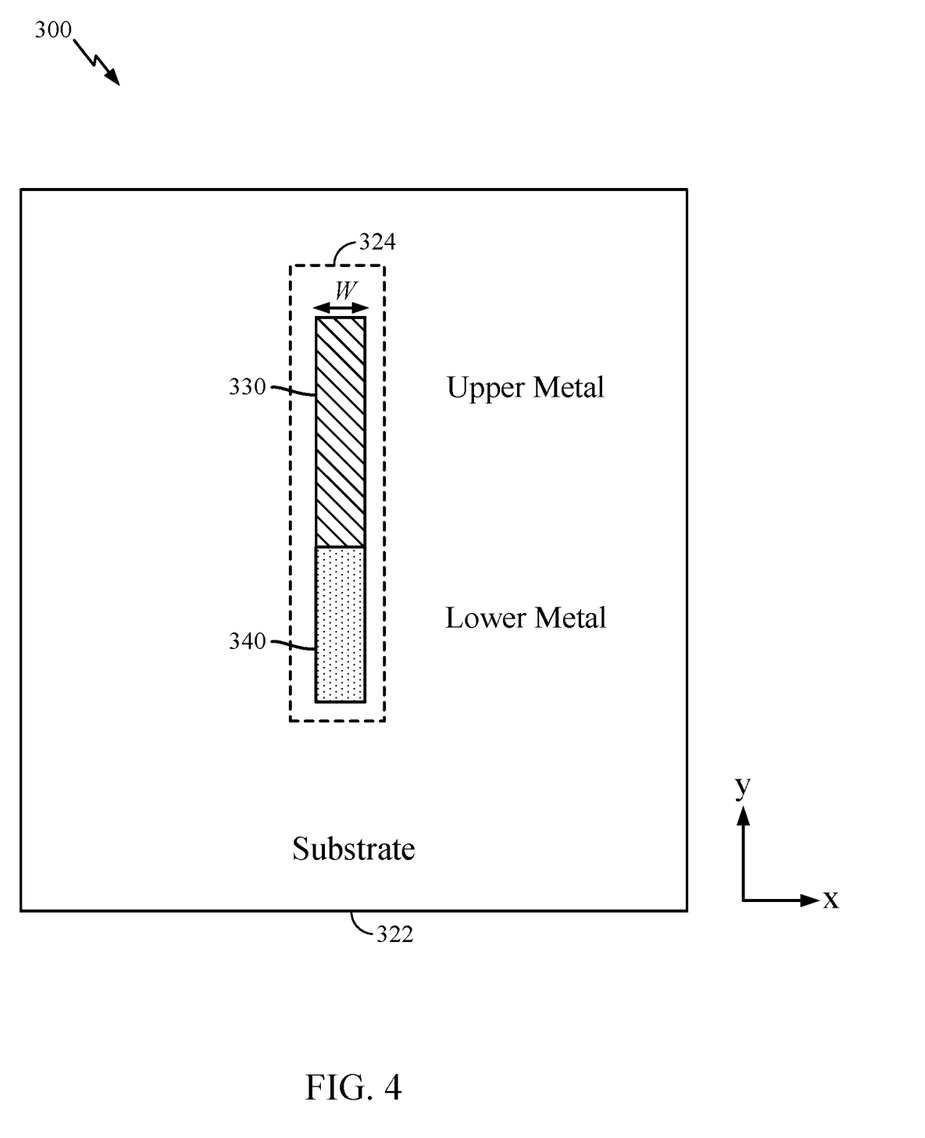
FIG. 4 illustrates a top view of the integrated circuit in FIG. 3, in accordance with certain aspects of the present disclosure.

In some aspects, the via-based vertical capacitor structure 324 may occupy a reduced amount of horizontal area (in the x-y plane) above the substrate 322, compared to the horizontal capacitive component 100. Referring to FIG. 4, for example, which shows a top view of the IC 300, the vertical capacitor structure 324 may have a reduced width approximately equal to W, relative to a width of 7 W for the horizontal capacitive component 100. This leads to a reduction in the horizontal area footprint, which in turn leads to reduced parasitic capacitance of the IC 300, because the horizontal area (in the x-y plane) of the vertical capacitor structure 324 in proximity to the horizontal plane of the substrate 322 has been substantially reduced, e.g., relative to the horizontal capacitive component 100.

Figure 5:
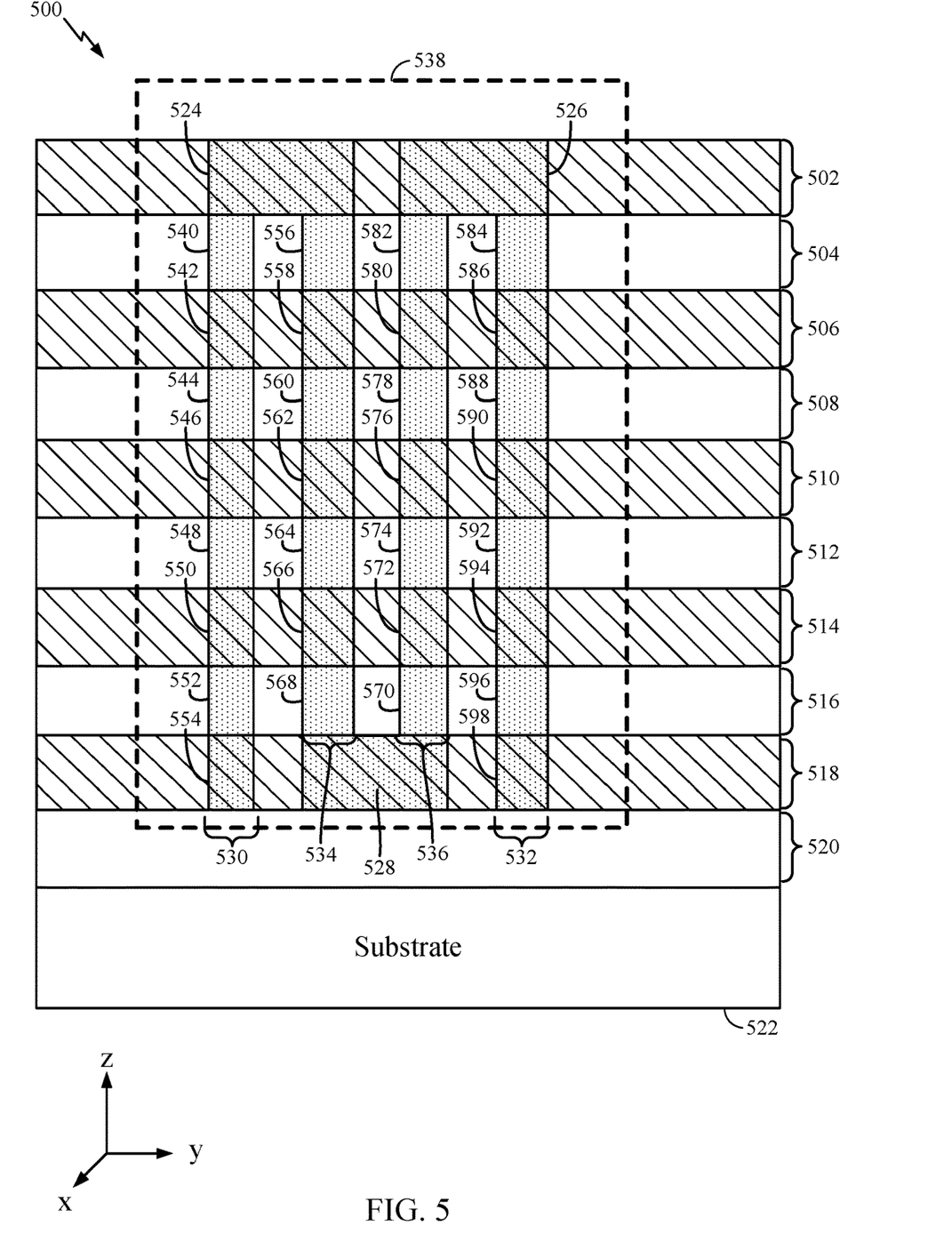
FIG. 5 illustrates a cross-sectional view of an integrated circuit that includes a via-based vertical resistor structure, in accordance with certain aspects of the present disclosure.

FIG. 5 illustrates a cross-sectional view of an example integrated circuit (IC) 500 with a vertical resistor structure 538, in accordance with certain aspects of the present disclosure. The IC 500 includes a substrate 522 (e.g., Si substrate) with a horizontal orientation in the x-y plane; electrically conductive layers 502, 506, 510, 514, and 518 (collectively referred to as "electrically conductive layers of IC 500") disposed above the substrate 522; and electrically insulative layers 504, 508, 512, and 516 (collectively referred to as "electrically insulative layers of IC 500") disposed above the substrate. While the IC 500 is depicted as having five electrically conductive layers, the reader is to understand that the IC 500 may include more or less than five electrically conductive layers. Similarly, while the IC 500 is depicted as having four electrically insulative layers, the reader is to understand that the IC 500 may include more or less than four electrically insulative layers.

In some aspects, each electrically insulative layer 504, 508, 512, and 516 may be disposed between a different pair of electrically conductive layers. In this particular example, electrically insulative layer 504 is disposed between electrically conductive layers 502 and 506; electrically insulative layer 508 is disposed between electrically conductive layers 506 and 510; electrically insulative layer 512 is disposed between electrically conductive layers 510 and 514; and electrically insulative layer 516 is disposed between electrically conductive layers 514 and 518. In other words, the electrically insulative layers may be interposed between the electrically conductive layers. In some aspects, the IC 500 may include a portion 520 disposed between the substrate 522 and the electrically conductive layer 518. The portion 520 may include multiple layers (not shown in FIG. 5) of the same or different materials. In some aspects, the portion 520 may include a dielectric material as illustrated.

Each of the electrically conductive layers of IC 500 may include a metal (e.g., Cu, Al, etc.), metal alloy, or silicon alloy. In some aspects, the electrically conductive layers of IC 500 may include the same material (e.g., metal, metal alloy, silicon alloy). In other aspects, at least one of the electrically conductive layers of IC 500 may include a different material than another one of the electrically conductive layers of IC 500.

Each of the electrically insulative layers of IC 500 may include a dielectric material (or a mixture of dielectric materials), such as $Al_2O_3$, $SiO_2$, $Si_3N_4$, etc. While each of the electrically conductive layers of IC 500 and each of the electrically insulative layers of IC 500 are depicted as having approximately the same height/thickness, the reader is to understand that each of the electrically conductive layers of IC 500 and/or each of the electrically insulative layers of IC 500 can have a different height/thickness from other layers.

As shown, the vertical resistor structure 538 is disposed in the electrically conductive layers of IC 500 and the electrically insulative layers of IC 500. Although the vertical resistor structure 538 is shown as occupying nearly all of the electrically conductive layers of IC 500 and the electrically insulative layers of IC 500 in the example of FIG. 5, the vertical resistor structure 538 need not utilize all or even the majority of the electrically conductive layers of IC 500 and the electrically insulative layers of IC 500. The vertical resistor structure 538 includes interconnection element 528 disposed in electrically conductive layer 518 above the substrate 522, and interconnection elements 524, 526 disposed in electrically conductive layer 502 above the interconnection element 528. Each of the interconnection elements 528, 524, and 526 may include a metal, metal alloy, or silicon alloy, e.g., for an electrically conductive trace of the respective interconnection element. Although FIG. 5 depicts the vertical resistor structure 538 with three interconnection elements, the reader is to understand that the vertical resistor structure 538 may include more or less than three interconnection elements. In general, referring to the example in FIG. 5, the vertical resistor structure may include one or more interconnection elements disposed in the electrically conductive layer 518 and one or more interconnection elements disposed in the electrically conductive layer 502.

In some aspects, the vertical resistor structure 538 may include one or more fingers that are disposed between and/or coupled to the interconnection element 528 and the interconnection elements 524 and 526. For example, as shown, fingers 534 and 536 are coupled to and disposed between the interconnection element 528 and the interconnection elements 524, 526. In some aspects, the vertical resistor structure 538 may include one or more fingers 530, 532 that are coupled to a single one of the interconnection elements 524 and 526. Although FIG. 5 depicts the vertical resistor structure 538 as having four fingers, the reader is to understand that the vertical resistor structure 538 may include more or less than four fingers.

As shown, fingers 530 and 532 extend vertically (e.g., in the z direction) across the electrically conductive layers 506, 510, 514, and 518, and across the electrically insulative layers 504, 508, 512, and 516. Similarly, fingers 534 and 536 extend vertically (e.g., in the z direction) across the electrically conductive layers 506, 510, and 514, and across the electrically insulative layers 504, 508, 512, and 516.

In some aspects, the interconnection elements 528, 524, 526, and fingers 530, 534, 536, and 532 may form a vertical interdigitated pattern (through the electrically conductive layers of IC 500 and through the electrically insulative layers of IC 500) with respect to the horizontal plane of the substrate. For example, as shown, finger 530 is coupled to interconnection element 524 and extends vertically (e.g., in the z direction) from the interconnection element 524; finger 534 is coupled to and disposed between the interconnection elements 524 and 528; finger 536 is coupled to and disposed between the interconnection elements 526 and 528; and finger 532 is coupled to the interconnection element 526 and extends vertically (e.g., in the z direction) from the interconnection element 526.

In some aspects, each finger 530, 534, 536, and 532 may include multiple stacked vias that extend vertically (e.g., in the z direction) through the electrically conductive layers of IC 500 and through the electrically insulative layers of IC 500. For example, finger 530 includes stacked vias 540, 542, 544, 546, 548, 550, 552, and 554 that extend through the electrically conductive layers 506, 510, 514, and 518 and through the electrically insulative layers 504, 508, 512, and 516. Similarly, finger 532 includes stacked vias 584, 586, 588, 590, 592, 594, 596, and 598 that extend through the electrically conductive layers 506, 510, 514, and 518 and through the electrically insulative layers 504, 508, 512, and 516. Finger 534 includes stacked vias 556, 558, 560, 562, 564, 566, and 568 that extend through the electrically conductive layers 506, 510, and 514 and through the electrically insulative layers 504, 508, 512, and 516. Likewise, in this reference example, finger 536 includes stacked vias 582, 580, 578, 576, 574, 572, and 570 that extend through the electrically conductive layers 506, 510, and 514 and through the electrically insulative layers 504, 508, 512, and 516. The stacked vias within each finger 530, 534, 536, and 532 may be electrically isolated from electrically conductive components within the electrically conductive layers through which the respective finger extends.

Figure 6:
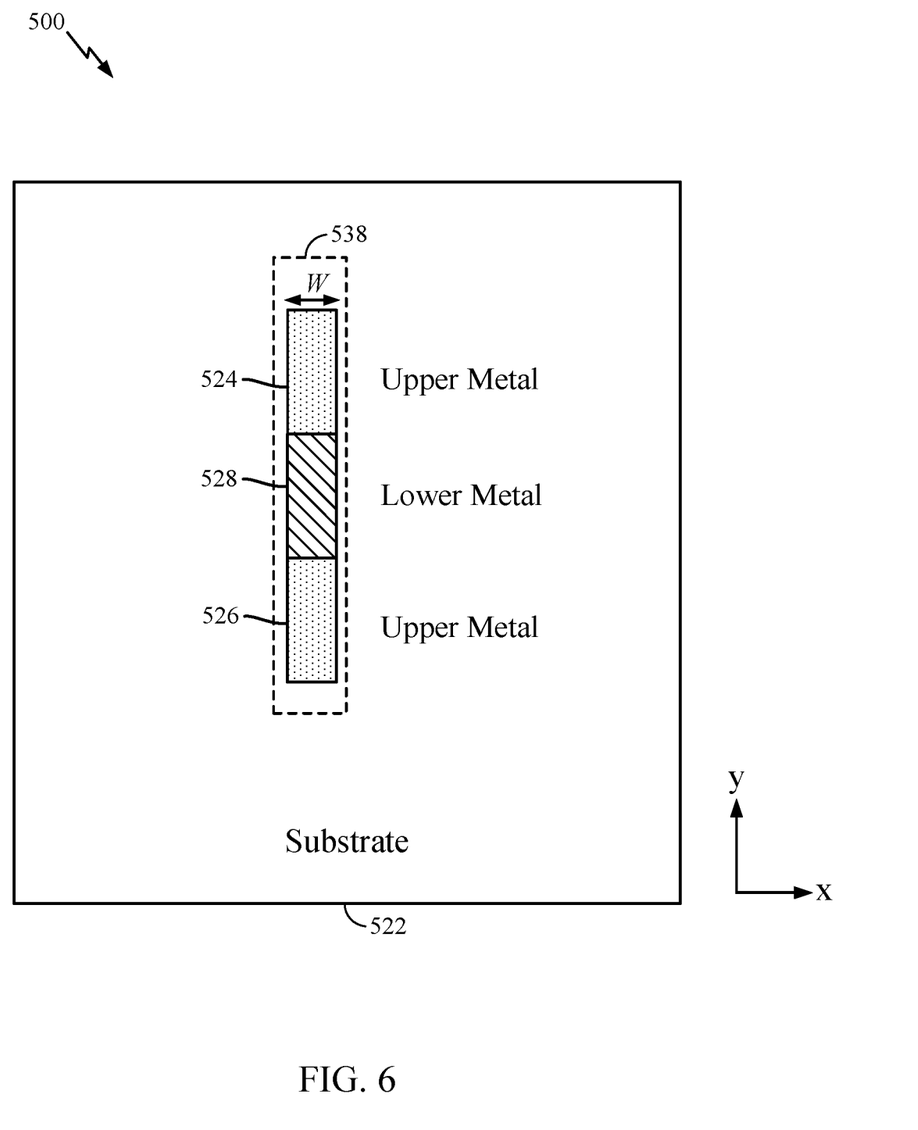
FIG. 6 illustrates a top view of the integrated circuit in FIG. 5, in accordance with certain aspects of the present disclosure.

In some aspects, the via-based vertical resistor structure 538 may occupy a reduced amount of horizontal area (in the x-y plane) above the substrate 522, relative to horizontal resistive components. Referring to FIG. 6, for example, which shows a top view of the IC 500, the vertical resistor structure 538 may have a reduced width approximately equal to W, relative to a width of 7 W for the horizontal resistive component 200. Similar to IC 300, this reduction in the width of the vertical resistor structure 538 can reduce the horizontal area footprint on the chip, and may lead to reduced parasitic capacitance of the IC 500, as the horizontal area (in the x-y plane) of the vertical resistor structure 538 in proximity to the horizontal plane of the substrate 522 has been reduced, relative to the horizontal resistive component 200.

According to some aspects, the vertical resistor structure 538 of FIG. 5 could be inverted, such that the two interconnection elements 524, 526 would be on a lower electrically conductive layer and interconnection element 528 would be on an upper electrically conductive layer. In this case, the ends of the vertical resistor structure may be on fingers 530, 532 in the upper electrically conductive layer.

Figure 7:
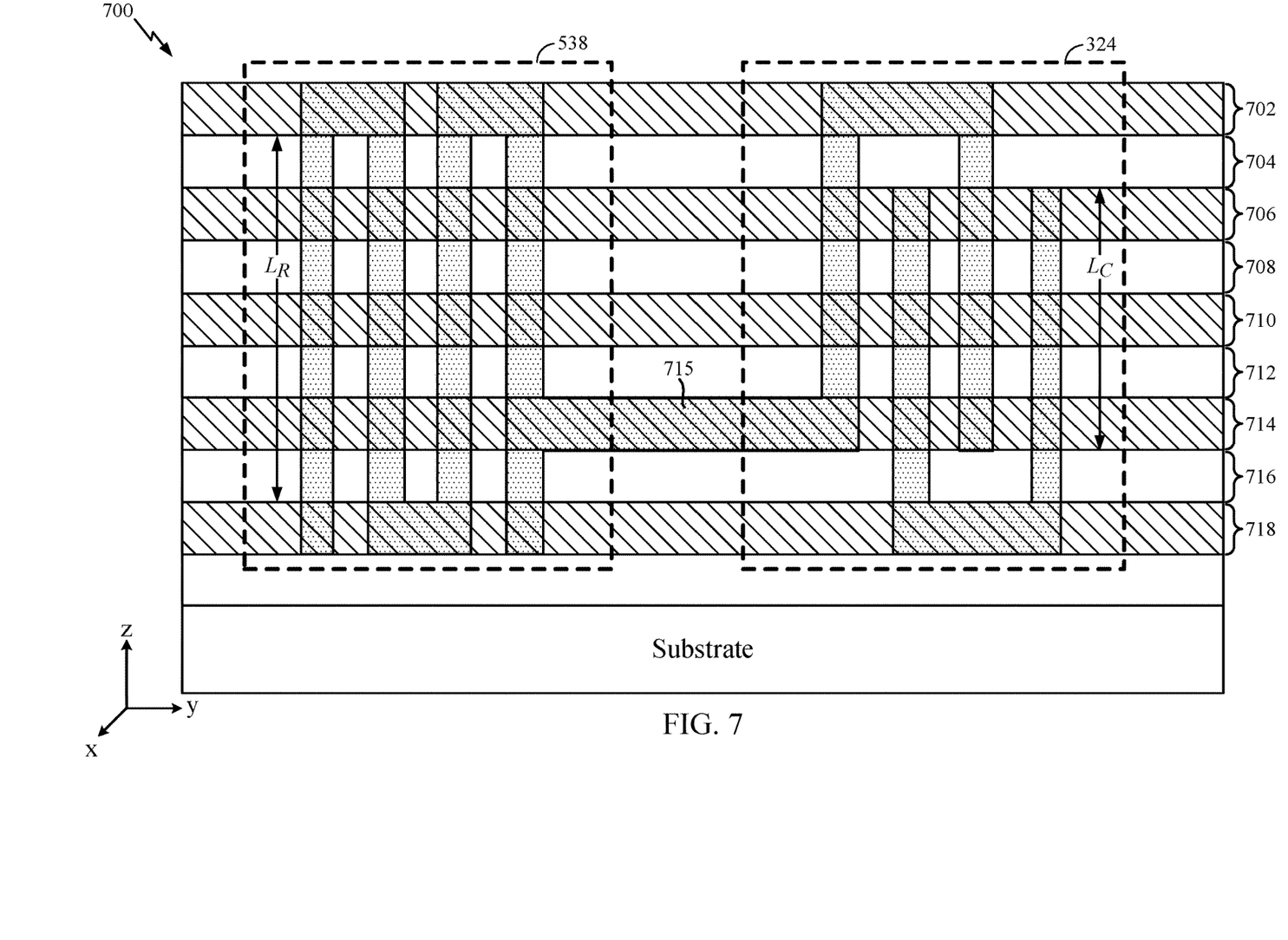
FIG. 7 illustrates a cross-sectional view of an example integrated circuit that includes a via-based vertical resistor structure and a via-based vertical capacitor structure, in accordance with certain aspects of the present disclosure.

In some aspects, an integrated circuit may include both a vertical capacitor structure and a vertical resistor structure. FIG. 7 shows a reference example of an integrated circuit (IC) 700 that includes vertical resistor structure 538 and vertical capacitor structure 324, according to certain aspects of the present disclosure. The vertical resistor structure 538 and the vertical capacitor structure 324 are disposed in the electrically conductive layers 702, 706, 710, 714, and 718 (collectively referred to as "electrically conductive layers of IC 700") and the electrically insulative layers 704, 708, 712, and 716 (collectively referred to as "electrically insulative layers of IC 700"). The electrically conductive layers of IC 700 and the electrically insulative layers of IC 700 may be similar, respectively, to the electrically conductive layers of ICs 300, 500 and the electrically insulative layers of ICs 300, 500.

Similar to ICs 300 and 500, while the IC 700 is depicted as having five electrically conductive layers and four electrically insulative layers, the IC 700 may include more or less than five electrically insulative layers and/or more or less than four electrically insulative layers. Further similar to ICs 300 and 500, while the vertical resistor and vertical capacitor structures 538, 324 are shown as occupying nearly all of the electrically conductive layers and the electrically insulative layers of IC 700 in the example of FIG. 7, the vertical resistor and vertical capacitor structures 538, 324 need not utilize all or even the majority of the electrically conductive layers of IC 700 and the electrically insulative layers of IC 700. Further, while the vertical resistor and vertical capacitor structures 538, 324 are shown as occupying the same set of electrically conductive layers of IC 700 and the electrically insulative layers of IC 700, the vertical resistor and vertical capacitor structures 538, 324 may be disposed in different sets of the electrically conductive layers of IC 700 and the electrically insulative layers of IC 700. For example, in some aspects, the vertical resistor structure 538 may be disposed in a higher or lower set of the electrically conductive layers and the electrically insulative layers of the IC 700, relative to the vertical capacitor structure 324.

In some aspects, the vertical resistor structure 538 may be coupled to the vertical capacitor structure 324 in IC 700, e.g., as part of an RC circuit. In this particular example, the vertical resistor structure 538 is coupled to the vertical capacitor structure 324 via an electrically conductive trace 715 of the electrically conductive layer 714. In other aspects, the vertical resistor structure 538 and the vertical capacitor structure 324 may be coupled together via one or more fingers shared between the vertical resistor structure 538 and the vertical capacitor structure 324. In one reference example, the rightmost finger (e.g., finger 532) of the vertical resistor structure 538 and the leftmost finger (e.g., finger 332) of the vertical capacitor structure 324 may be the same finger (e.g., in IC 700) that couples the vertical resistor structure 538 and the vertical capacitor structure.

In cases where the IC 700 includes a vertical resistor structure 538 and a vertical capacitor structure 324, aspects may allow for the IC 700 to have a process-invariant RC time constant (e.g., the integrated circuit may not suffer variations in the RC time constant due to process variations that occur during fabrication of the integrated circuit). For example, referring to the vertical resistor structure 538 of IC 700, if a uniform distributed current density is assumed, the resistance $$R = \rho \frac{L_R}{T \times W} \frac{L}{T \times W},$$

where $\rho$ is the resistivity constant, $L_R$ is length of the overlap region of the fingers, T is the thickness, and W is width of a trace. Referring to the vertical capacitor structure 324 of IC 700, if fringing capacitance is neglected, the vertical capacitance $$C = \varepsilon \frac{L_C \times T}{G},$$

where $\varepsilon$ represents the dielectric constant, $L_C$ is the length of the overlap region of the fingers, T is the thickness, and G is gap distance between fingers. Thus, the RC time constant in this case may be equal to $$\rho\varepsilon \frac{L_R L_C}{W \times G} \text{ or } \rho\varepsilon \frac{L^2}{W \times G}$$

(assuming $L_R=L_C$), where the metal thickness T is canceled. In the above, assuming W=G, if width W is reduced by a % (e.g., due to over etching), then gap distance G may increase by a %, resulting in W (1−a %)×G (1+a %)≈W×G. In this case, assuming $L_R L_C$ is large, the process variation may be insignificant, and $\rho$ and $\varepsilon$ may remain stable over the fabrication process. In cases where W≠G, the RC time constant may have some process invariance, e.g., due to the opposite direction of changes in R and C.

Figure 8:
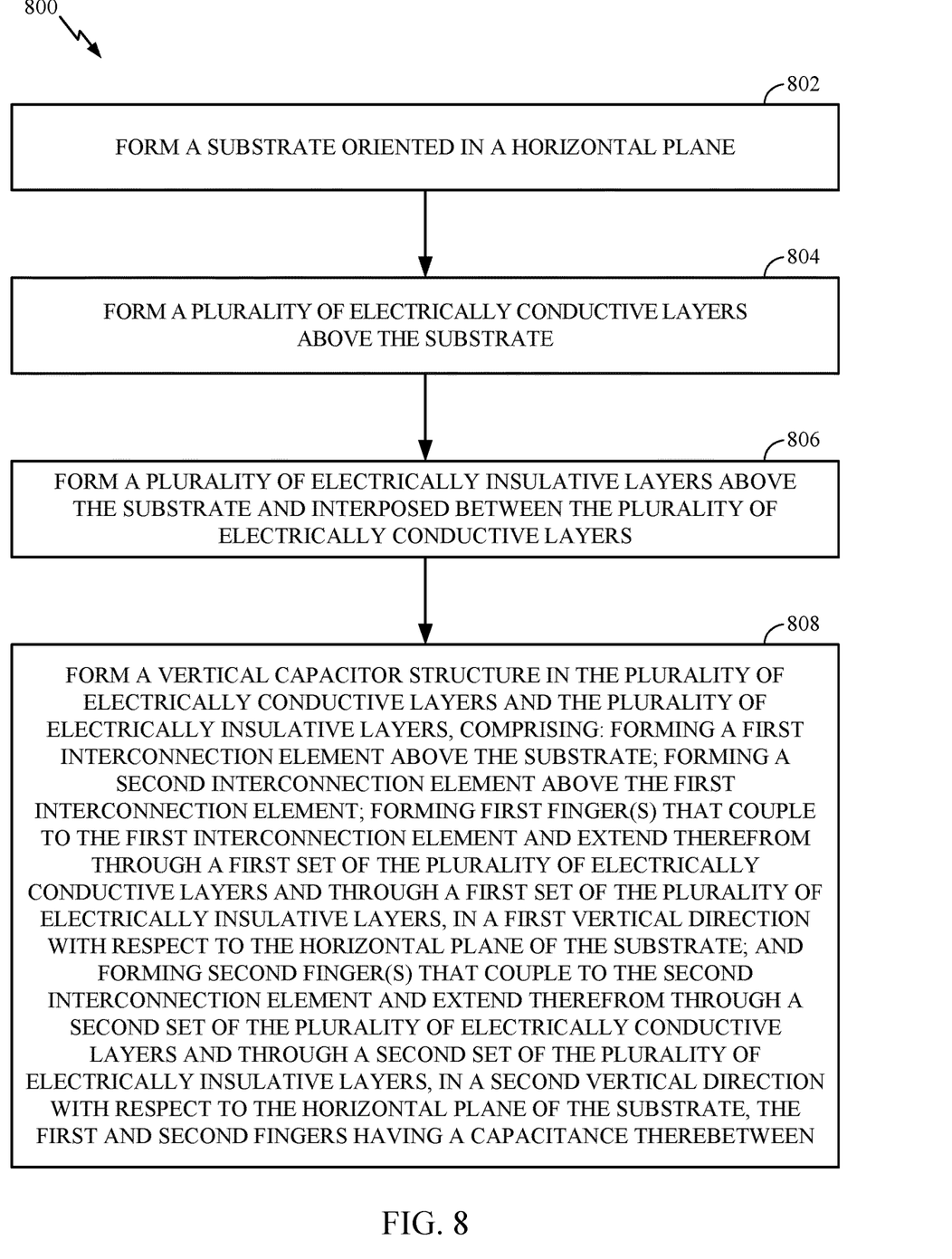
FIG. 8 is a flow diagram of example operations for fabricating an integrated circuit that includes a via-based vertical capacitor structure, in accordance with certain aspects of the present disclosure.

FIG. 8 is a flow diagram of example operations 800 for fabricating an integrated circuit that includes a vertical capacitor structure (e.g., vertical capacitor structure 324), in accordance with certain aspects of the present disclosure. The operations 800 may be performed, for example, by a semiconductor processing chamber.

The operations 800 may begin, at block 802, by forming a substrate (e.g., substrate 322) oriented in a horizontal plane. At block 804, a plurality of electrically conductive layers (e.g., electrically conductive layers 302 and 318) are formed above the substrate. At block 806, a plurality of electrically insulative layers (e.g., electrically insulative layers 304, 308, 312, and 316) are formed above the substrate and interposed between the plurality of electrically conductive layers.

At block 808, the vertical capacitor structure is formed in the plurality of electrically conductive layers and the plurality of electrically insulative layers. In some aspects, forming the vertical capacitor structure may include forming a first interconnection element (e.g., interconnection element 340) above the substrate; and forming a second interconnection element (e.g., interconnection element 330) above the first interconnection element. In some aspects, the first interconnection element may be disposed in one of the plurality of electrically conductive layers (e.g., electrically conductive layer 318) and the second interconnection element may be formed in another one of the plurality of electrically conductive layers (e.g., electrically conductive layer 302), further away from the substrate than the one of the plurality of electrically conductive layers. At least one of the first interconnection element or the second interconnection element may include an electrically conductive trace, and the electrically conductive trace may be coupled to an electrically conductive element in one of the plurality of electrically conductive layers.

Forming the vertical capacitor structure may also include forming one or more first fingers (e.g., fingers 342, 344) that couple to the first interconnection element and extend therefrom through a first set of the plurality of electrically conductive layers (e.g., electrically conductive layers 314, 310, 306) and through a first set of the plurality of electrically insulative layers (e.g., electrically insulative layers 316, 312, 308), in a first vertical direction with respect to the horizontal plane of the substrate. Forming the vertical capacitor structure may further include forming one or more second fingers (e.g., fingers 332, 334) that couple to the second interconnection element and extend therefrom through a second set of the plurality of electrically conductive layers (e.g., electrically conductive layers 306, 310, 314) and through a second set of the plurality of electrically insulative layers (e.g., electrically insulative layers 304, 308, 312), in a second vertical direction with respect to the horizontal plane of the substrate. The first and second fingers have a capacitance therebetween.

In some aspects, each of the first finger(s) may include one or more vias (e.g., vias 362, 364, 366, 368, 370, and 372 of finger 342 and vias 386, 388, 390, 392, 394, and 396 of finger 344) extending through the first set of the plurality of electrically conductive layers and through the first set of the plurality of electrically insulative layers, in the first vertical direction. In some aspects, each of the second finger(s) may include one or more vias (e.g., vias 350, 352, 354, 356, 358, and 360 of finger 332, and vias 374, 376, 378, 380, 382, and 384 of finger 334) extending through the second set of the plurality of electrically conductive layers and through the second set of the plurality of electrically insulative layers, in the second vertical direction. In some aspects, the vias of the first and second finger(s) may be electrically isolated from other electrically conductive elements in each of the plurality of electrically conductive layers.

In some aspects, operations 800 may further include forming at least one vertical resistor structure (e.g., vertical resistor structure 538) in the plurality of electrically conductive layers and the plurality of electrically insulative layers. The vertical resistor structure may be coupled to the vertical capacitor structure.

Figure 9:
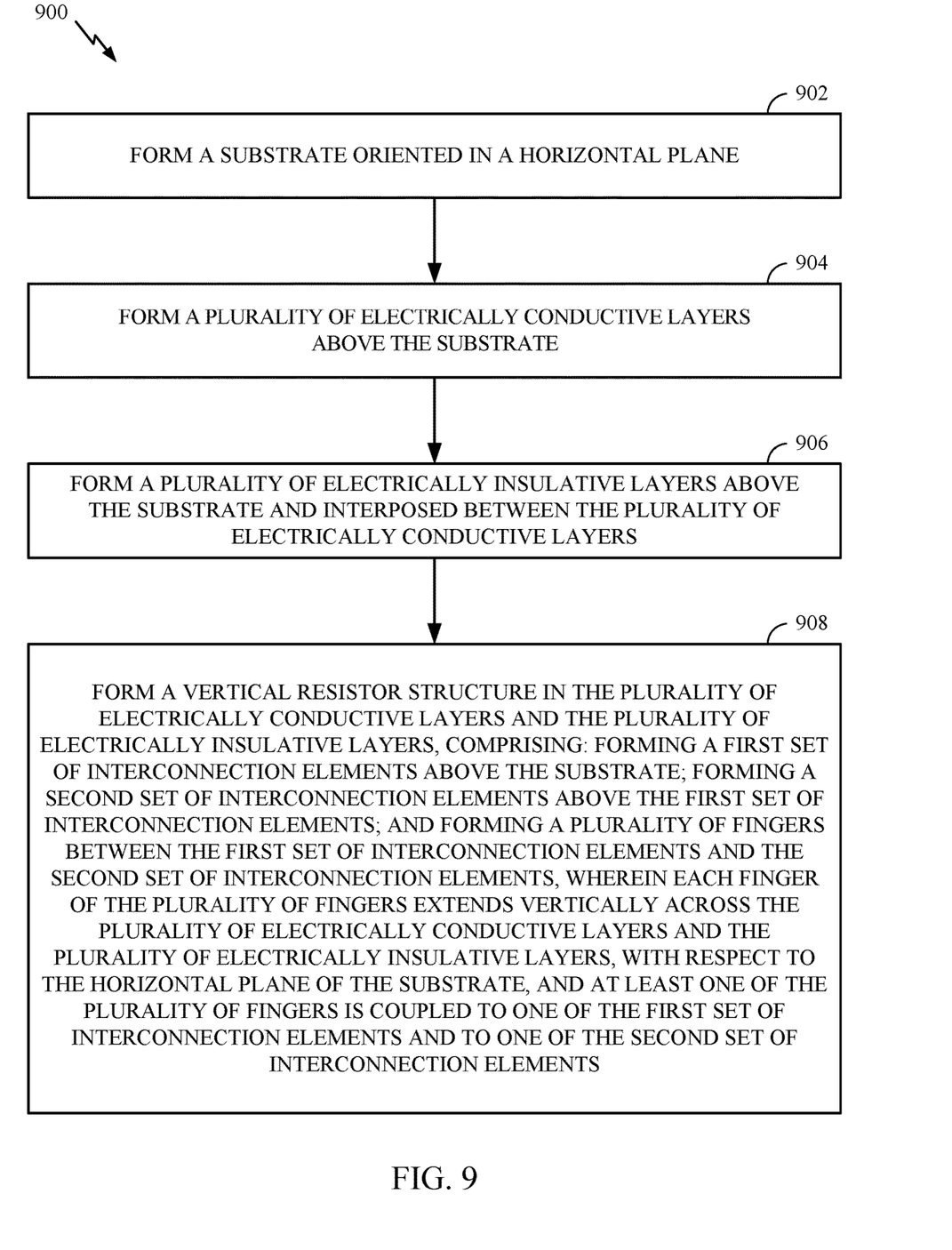
FIG. 9 is a flow diagram of example operations for fabricating an integrated circuit that includes a via-based vertical resistor structure, in accordance with certain aspects of the present disclosure.

FIG. 9 is a flow diagram of example operations 900 for fabricating an integrated circuit that includes a vertical resistor structure (e.g., vertical resistor structure 538), in accordance with certain aspects of the present disclosure. The operations 900 may be performed, for example, by a semiconductor processing chamber.

The operations 900 may begin, at block 902, by forming a substrate (e.g., substrate 522) oriented in a horizontal plane. At block 904, a plurality of electrically conductive layers (e.g., electrically conductive layers 502 and 518) are formed above the substrate. At block 906, a plurality of electrically insulative layers (e.g., electrically insulative layers 504, 508, 512, and 516) are formed above the substrate and interposed between the plurality of electrically conductive layers.

At block 908, the vertical resistor structure is formed in the plurality of electrically conductive layers and the plurality of electrically insulative layers. Forming the vertical resistor structure may include forming a first set of interconnection elements (e.g., interconnection element 528) above the substrate; forming a second set of interconnection elements (e.g., interconnection elements 524 and 526) above the first set of interconnection elements; and forming a plurality of fingers (e.g., fingers 534 and 536) between the first set of interconnection elements and the second set of interconnection elements. In some aspects, the first set of interconnection elements may be formed in a same one of the plurality of electrically conductive layers (e.g., electrically conductive layer 518). In some aspects, the second set of interconnection elements may be formed in a same another one of the plurality of electrically conductive layers (e.g., electrically conductive layer 502).

In some aspects, each finger of the plurality of fingers may extend vertically across the plurality of electrically conductive layers and the plurality of electrically insulative layers, with respect to the horizontal plane of the substrate. In some aspects, at least one of the plurality of fingers (e.g., fingers 534 and 536) may be coupled to one of the first set of interconnection elements and to one of the second set of interconnection elements. In some aspects, each finger of the plurality of fingers may include a plurality of stacked vias (e.g., vias 540, 542, 544, 546, 548, 550, 552, and 554 of finger 530, vias 556, 558, 560, 562, 564, 566, and 568 of finger 534, vias 570, 572, 574, 576, 578, 580, and 582 of finger 536, and vias 584, 586, 588, 590, 592, 594, 596, and 598 of finger 532) extending vertically through the plurality of electrically conductive layers and the plurality of electrically insulative layers, with respect to the horizontal plane of the substrate.

In some aspects, the plurality of fingers, the first set of interconnection elements, and the second set of interconnection elements may form a vertical interdigitated pattern with respect to the horizontal plane of the substrate through the plurality of electrically conductive layers and the plurality of electrically insulative layers.

In some aspects, the operations 900 may include forming a first finger (e.g., finger 534) of the plurality of fingers between a first interconnection element (e.g., interconnection element 528) of the first set of interconnection elements and a first interconnection element (e.g., interconnection element 524) of the second set of interconnection elements; forming a second finger (e.g., finger 536) of the plurality of fingers between a second interconnection element (e.g., interconnection element 526) of the second set of interconnection elements and the first interconnection element (e.g., interconnection element 528) of the first set of interconnection elements; and forming a third finger (e.g., finger 530) of the plurality of fingers that couples to and extends vertically from the first interconnection element (e.g., interconnection element 524) of the second set of interconnection elements. In some aspects, the operations 900 may further include forming a fourth finger (e.g., finger 532) of the plurality of fingers that is coupled to and extends vertically from the second interconnection element (e.g., interconnection element 526) of the second set of interconnection elements.

In some aspects, operations 900 may further include forming at least one vertical capacitor structure (e.g., vertical capacitor structure 324) in the plurality of electrically conductive layers and the plurality of electrically insulative layers. The vertical resistor structure may be coupled to the vertical capacitor structure.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. An integrated circuit including a vertical capacitor structure, comprising:
   a substrate oriented in a horizontal plane;
   a plurality of electrically conductive layers disposed above the substrate;
   a plurality of electrically insulative layers disposed above the substrate and interposed between the plurality of electrically conductive layers; and
   the vertical capacitor structure disposed in the plurality of electrically conductive layers and the plurality of electrically insulative layers, the vertical capacitor structure comprising:
   a first interconnection element disposed above the substrate;
   a second interconnection element disposed above the first interconnection element;
   one or more first fingers coupled to the first interconnection element and extending therefrom through a first set of the plurality of electrically conductive layers and through a first set of the plurality of electrically insulative layers, in a first vertical direction with respect to the horizontal plane of the substrate; and one or more second fingers coupled to the second interconnection element and extending therefrom through a second set of the plurality of electrically conductive layers and through a second set of the plurality of electrically insulative layers, in a second vertical direction with respect to the horizontal plane of the substrate, the first and second fingers having a capacitance therebetween.

2. The integrated circuit of claim 1, wherein each of the one or more first fingers comprises one or more vias extending through the first set of the plurality of electrically conductive layers and through the first set of the plurality of electrically insulative layers, in the first vertical direction.

3. The integrated circuit of claim 2, wherein the one or more vias comprise a plurality of stacked vias.

4. The integrated circuit of claim 2, wherein the one or more vias are electrically isolated from other electrically conductive elements in each of the plurality of electrically conductive layers.

5. The integrated circuit of claim 1, wherein each of the one or more second fingers comprises one or more vias extending through the second set of the plurality of electrically conductive layers and through the second set of the plurality of electrically insulative layers, in the second vertical direction.

6. The integrated circuit of claim 5, wherein the one or more vias are electrically isolated from other electrically conductive elements in each of the plurality of electrically conductive layers.

7. The integrated circuit of claim 1, wherein each of the plurality of electrically conductive layers comprises a metal, metal alloy, or silicon alloy.

8. The integrated circuit of claim 7, wherein each of the plurality of electrically insulative layers comprises a dielectric.

9. The integrated circuit of claim 1, wherein at least one of the first interconnection element or the second interconnection element comprises a metal, metal alloy, or silicon alloy.

10. The integrated circuit of claim 1, wherein at least one of the first interconnection element or the second interconnection element comprises an electrically conductive trace.

11. The integrated circuit of claim 10, wherein the electrically conductive trace is coupled to an electrically conductive element in one of the plurality of electrically conductive layers.

12. The integrated circuit of claim 1, wherein the first interconnection element is disposed in one of the plurality of electrically conductive layers and wherein the second interconnection element is disposed in another one of the plurality of electrically conductive layers, further away from the substrate than the one of the plurality of electrically conductive layers.

* * * * *